United States Patent [19]

de la Chapelle et al.

[11] Patent Number: 4,575,693
[45] Date of Patent: Mar. 11, 1986

[54] HIGH CURRENT PULSE MODULATOR WITH WAVE SHAPING CAPABILITY

[75] Inventors: Michael de la Chapelle, Canoga Park; Frank A. Wilhelmi, Simi, both of Calif.

[73] Assignee: Hughes Aircraft Company, El Segundo, Calif.

[21] Appl. No.: 492,513

[22] Filed: May 9, 1983

[51] Int. Cl.[4] .......................... H04B 3/04; H03K 5/07
[52] U.S. Cl. ..................................... 333/20; 307/268; 328/67; 328/74; 333/23
[58] Field of Search .................. 307/268, 317 R, 318, 307/319, 320; 328/65, 67, 74; 333/20, 23

[56] References Cited

U.S. PATENT DOCUMENTS

| | | |
|---|---|---|
| 2,947,884 | 8/1960 | Horodyski ............................ 328/67 |
| 3,737,679 | 6/1973 | Cooper . |
| 3,832,568 | 8/1974 | Wang . |
| 3,881,120 | 4/1975 | Osterwalder . |
| 4,099,128 | 7/1978 | Hooper . |
| 4,115,708 | 9/1978 | Liv ...................................... 307/268 |
| 4,328,470 | 5/1982 | Bumgardner . |

FOREIGN PATENT DOCUMENTS 450340  4/1975  U.S.S.R. ................................ 328/67

Primary Examiner—John Zazworsky
Attorney, Agent, or Firm—Charles D. Brown; A. W. Karambelas

[57] ABSTRACT

A pulse modulator including a pulse forming network comprising a multiple section ladder network of series inductors and shunt capacitors. The series inductors are flat, spiral inductors etched on microstrip. The pulse forming network is charged negatively through an IMPATT diode, and is switched to ground by a set of p-channel VMOS power FETs. By switching off the FET switches before the pulse forming network is completely dicharged, the fall time of the current pulse is reduced. The shape of the current pulse can be adjusted by varying the impedance of the section or sections of the pulse forming network whose position in the network corresponds to the position in the current pulse which it is desired to change. The variation in impedance is realized by bringing metallic slugs, mounted in the housing of the pulse forming network, into proximity with the flat, spiral inductors.

1 Claim, 6 Drawing Figures

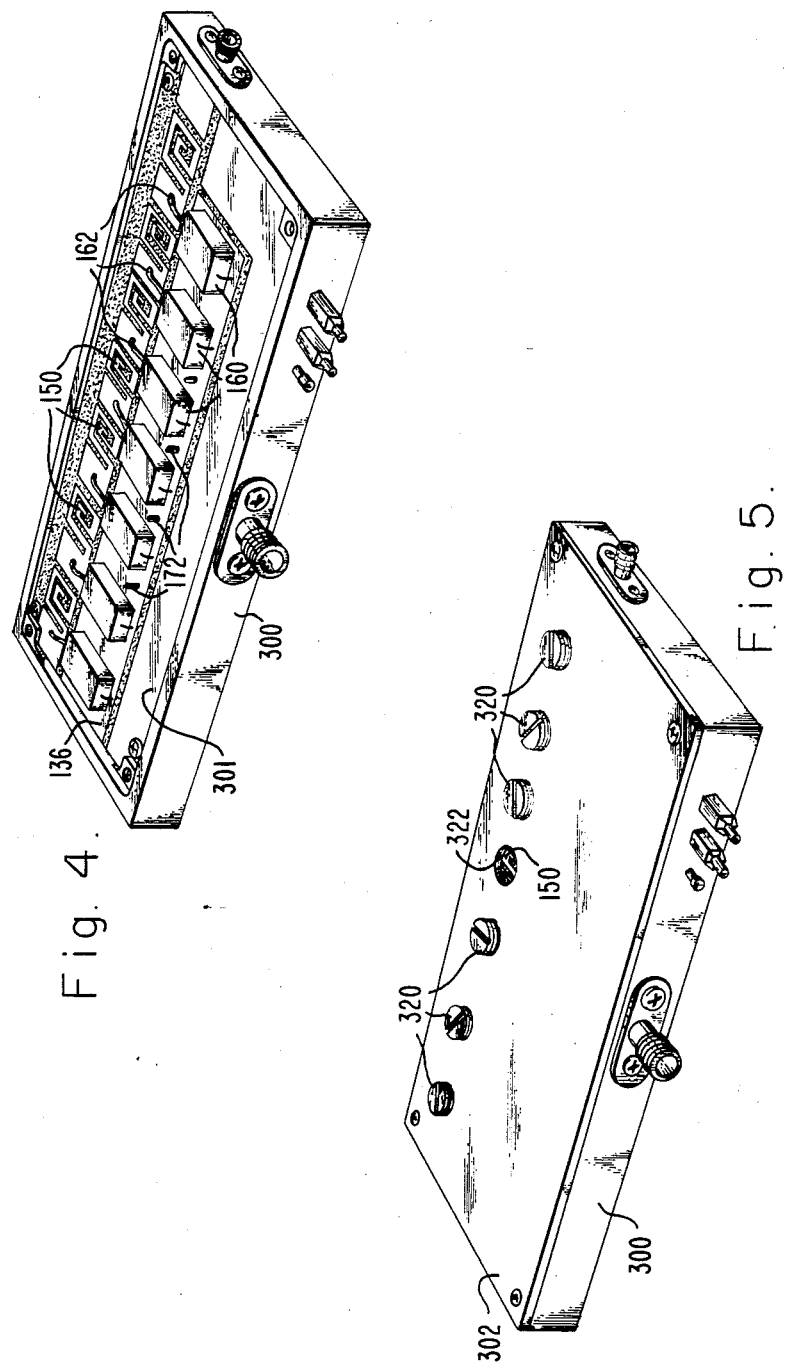

HIGH CURRENT PULSE MODULATOR WITH WAVE SHAPING CAPABILITY

The United States Government has rights in this invention pursuant to Air Force contract number F 08635-79-C-0251.

BACKGROUND OF THE INVENTION

1. Field of the Invention

This invention relates to current pulse modulator circuits for use in radar applications and in particular to such modulators employing a pulse forming network to drive an rf generator.

2. Description of the Prior Art

The operation of current pulse modulators and their role in radar applications is well understood. The interested reader may find suitable background information in a number of U.S. Patents including:

| U.S. Pat. No. | Issue Date | Inventor |
| --- | --- | --- |
| 3,611,210 | October 5, 1971 | Theodore |
| 3,737,679 | June 5, 1973 | Cooper |
| 3,832,568 | August 27, 1974 | Wang |
| 3,881,120 | April 29, 1975 | Osterwalder |
| 4,001,598 | January 4, 1977 | Johannessen |
| 4,099,128 | July 4, 1978 | Hooper |
| 4,328,470 | May 4, 1982 | Bumgardner |

Most of the pulse modulator circuits shown in the listed patents follow the traditional design of such circuits. The traditional design includes such elements as a pulse forming network (PFN) which is charged from a D.C. power supply through a charging choke and a holdoff diode. A trigger means (or switch) is coupled to the PFN and when triggered, causes the PFN to discharge through a load for generating microwave energy. The load device may be a tube device, a thyratron, or similar device which generally will not conduct in the reverse direction. Typically, the PFN is a multistage ladder network of inductors and capacitors. The trigger means is typically a silicon controlled rectifier (SCR) connected to the high side of the PFN. A pulse modulator design employing an IMPATT diode, but which does not use a ladder network of inductors and capacitors, is illustrated in the patent to Bumgardner. That patent also provides some helpful discussion of the nature and operation of the IMPATT diode. Such PFN of the prior art may have the capability of providing a pulse of adjustable duration or having adjustable feedback to tailor the source impedance and characteristics of the modulator to the particular IMPATT diode used, thereby improving operating efficiency, stability, and transient response. (See particularly Bumgardner, Col. 5, ll. 14–31.)

SUMMARY OF THE INVENTION

The invention is a high current, light weight pulse modulator circuit. The modulator includes a pulse forming network (PFN) which consists of a multiple section ladder network of series inductors and shunt capacitors. The series inductors are flat spiral inductors etched on microstrip. The PFN is charged negatively through an IMPATT diode. When charging of the PFN is complete, the bottom of the PFN (i.e., the common junction of all shunt capacitors) is switched to ground by a set of p-channel VMOSA power FETs. The top of the PFN (i.e., the junction of the PFN and the cathode of the IMPATT diode) then rises to a positive voltage which induces the PFN to discharge, section by section, into the IMPATT diode load causing it to generate microwave energy.

The fall time of the microwave current pulse is greatly decreased in the inventive circuit by switching off the FET switches before the PFN is completely discharged. The PFN is then resonantly charged through the now forward biased IMPATT diode to a negative potential in preparation for the next pulse generation. Tuning of the shape of the current pulse is achieved by varying the impedance of the section or sections of the PFN corresponding to the shape of the desired pulse waveform. The variation in impedance is realized by bringing metallic slugs into adjustable proximity with the flat, spiral inductors. The metallic slugs are mounted in threaded holes provided in the housing of the modulator and juxtaposed with a respective one of the inductors.

BRIEF DESCRIPTION OF THE DRAWINGS

FIG. 4 shows the modulator circuit in its housing, with the cover removed.

FIG. 5 is an exterior perspective view of the modulator housing particularly illustrating the impedance adjusting slugs.

DETAILED DESCRIPTION OF THE INVENTION

Figure 1:
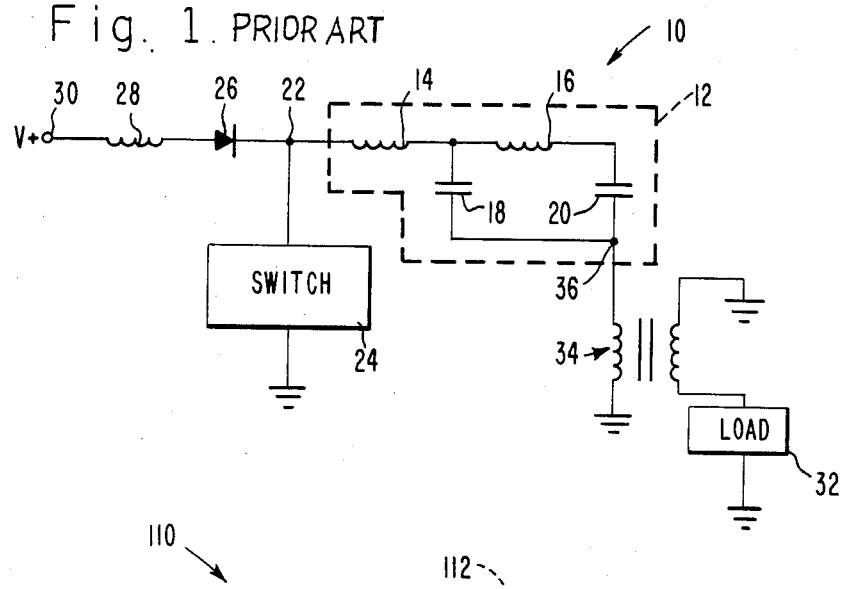
FIG. 1 is a circuit diagram of a pulse modulator according to the prior art.

The typical circuit configuration for a pulse forming network of a pulse modulator is shown in FIG. 1. That configuration has been described by Rudolf F. Graf in *Electronics Design Data Book*, 1971, Van Nostrand Reinhold Company, page 124. The pulse modulator 10 comprises a pulse forming network 12 such as the two-section PFN comprised of series connected inductors 14 and 16 and shunt connected capacitors 18 and 20. The top terminal of the PFN 12, represented by node 22, is connected to one terminal of a switching means 24, the other terminal of which is connected to ground. Node 22 is also connected to the cathode of hold-off diode 26, the anode of which is connected through charging choke 28 to the positive terminal 30 of a D.C. power supply (not shown). A load 32 is coupled through an inverting pulse transformer 34 to the bottom terminal of PFN 12, represented by node 36. The load may be an antenna (see Osterwalder) a Klystron tube (see Hooper) a step recovery diode (see Wang) or some type of tube device (see Cooper) which typically will not conduct in the reverse direction.

To design a PFN such as shown in FIG. 1, the designer first specifies the characteristic impedance $Z_o$, the current pulsewidth $P_w$ and the desired rise time r for the current pulse. The inductance (L) and capacitance (C) per section, and the number of sections n, required to meet the specified values can then be calculated using the following equations:

$$Z_0 = \sqrt{L/C} \qquad (1)$$

$$P_w = 2 \cdot n \sqrt{L \cdot C} \qquad (2)$$

and $$n = P_w/2 \cdot r \qquad (3)$$

The use of pulse forming networks to generate pulses having a pulsewidth $P_w$ greater than 100 nanoseconds generally becomes impractical due to the large number of sections required by equation (3). Even more sections than indicated by equation (3) may be used if it is decided that additional sections are needed to reduce pulse ripple. In designing such a circuit, the characteristic impedance of the PFN must be chosen to match that of the load or an impedance transformer must be placed at the output of the PFN in order to prevent reflections off the load.

The radar pulse modulator circuit design shown in FIG. 1 employs the traditional method of charging the top (node 22) of the PFN to a positive voltage, and then toggling the switch 24 to connect the top of the PFN to ground. Switching node 22 to ground causes the bottom of the PFN (i.e., node 36) to fall to a negative potential, thus delivering a *negative* current pulse to the load device 32. Since IMPATT diodes are most often mounted in an anode grounded configuration, a *positive* current pulse would be required to modulate an IMPATT diode load. Thus, in this traditional design, an inverting pulse transformer 34 would be required to invert the current pulse for an IMPATT diode load. The disadvantages resulting from the use of the inverting transformer 34 are increased rise and fall time with consequent degradation of performance, and increased size and weight of the pulse modulator 10.

Figure 2:
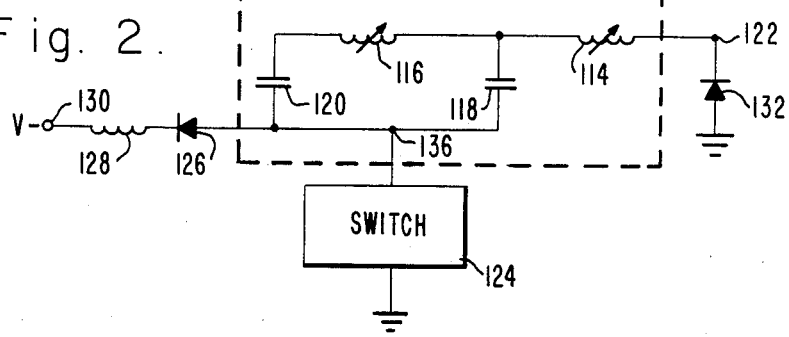
FIG. 2 is a corresponding circuit diagram of the pulse modulator according to the invention.

The pulse modulator 110 illustrated by the circuit of FIG. 2 eliminates the need for an inverting transformer. The pulse forming network 112 is shown as a two-section PFN comprised of series connected inductors 114 and 116 and shunt connected capacitors 118 and 120 and is substantially the same as PFN 112 of FIG. 1. However, the top terminal of the PFN 112, represented by node 122 is connected to the cathode of an IMPATT diode 132, and the bottom terminal of PFN, represented by node 136, is connected to one terminal of switching device 124 and to the anode of hold-off diode 126. The cathode of diode 126 is connected through charging choke 128 to the *negative* terminal 130 of a D.C. power supply (not shown). The other terminal of switch device 124 and the anode of IMPATT diode 132 are connected to ground. The IMPATT diode offers the advantages of light weight and solid state reliability in comparison to the traveling wave tube sources of microwave energy.

Figure 3:
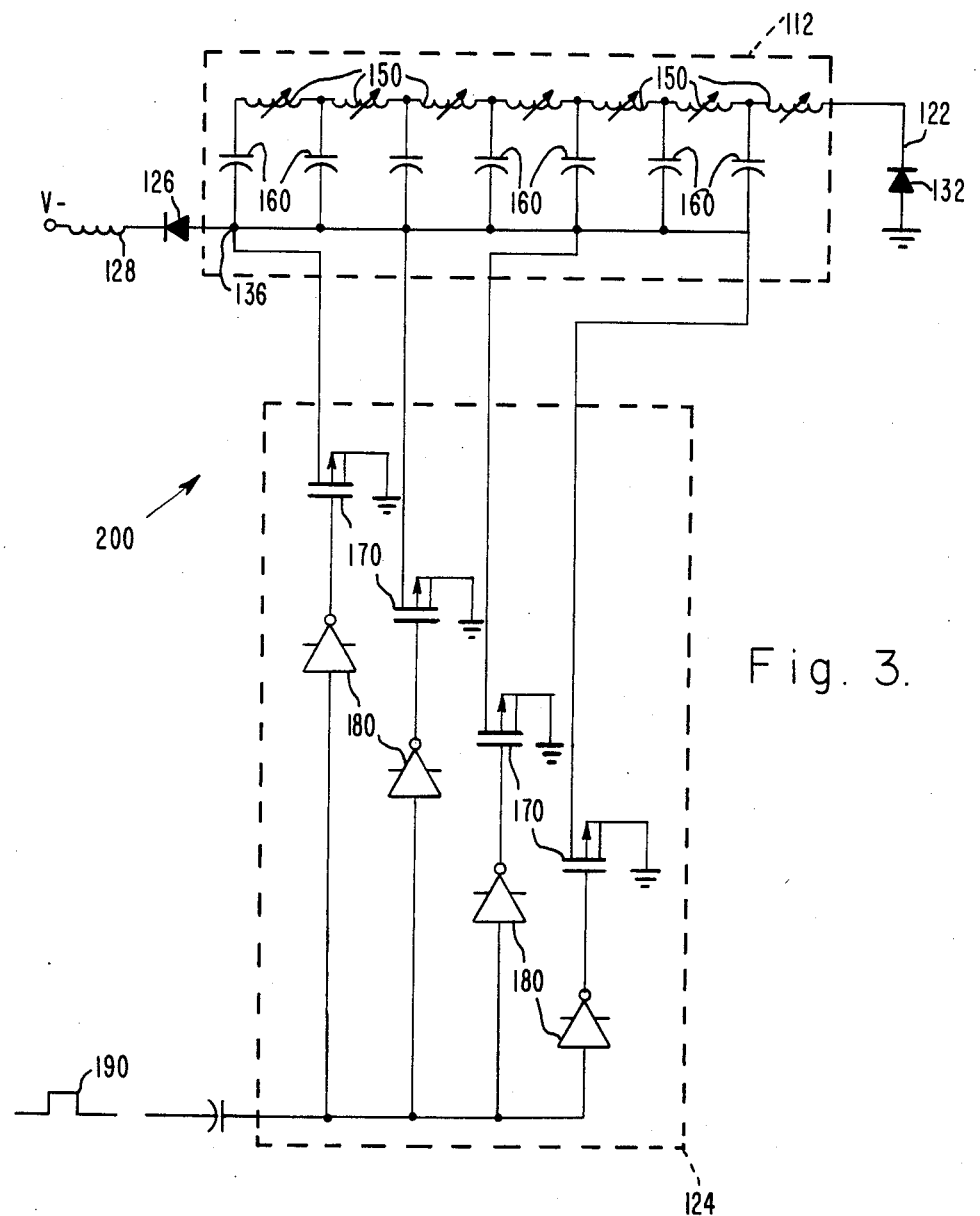
FIG. 3 is a complete circuit diagram of the pulse modulator as constructed, particularly showing the configuration of the switching means.

The pulse modulator 200, as actually built and tested, took the form as shown in FIG. 3. The pulse forming network 112 included seven series connected inductors 150 and seven shunt connected capacitors 160. The seven inductors 150 are shown as variable inductors since their effective inductance may be changed by adjustment of the position of slugs 320 as described with reference to FIG. 5. Nominally, the inductor at each end of the seven series connected inductors 150 should be about 1.15 times the value of the other inductors as determined by equations (1)-(4). The PFN is charged negatively through the IMPATT diode 132. When charging is completed, the bottom (node 136) of the PFN is switched to ground by a switching means 124 including a set of p-channel VMOS power FETs 170. The top (node 122) of the PFN then rises to a positive voltage which induces the PFN to discharge, section by section, into the IMPATT diode 132. Because a positive pulse is delivered to the cathode of the IMPATT diode 132, no inverting transformer 34 is required. The fall time of the current pulse (see FIG. 6) is greatly decreased by switching off the FET switches 170 before the PFN is completely discharged. The PFN is then resonantly charged, through the now forward biased IMPATT diode, to a negative voltage in preparation for the generation of the next pulse. Typical load devices of the prior art (e.g. tube devices) cannot conduct in the reverse direction and consequently could not be used to recharge the PFN.

The switching means 124 could be constructed by using thyratrons, spark switches or SCRs (silicon controlled rectifiers) in place of the FETs 170. However, the high power VMOS FETs are preferred. Their use as shown in FIG. 3 results in a significant improvement in the pulse modulator performance. By connecting a plurality of power FETs 170 in parallel, their inherent ON resistance can be decreased, and the current handling capability of the switch 124 can be increased. Unfortunately, FETs tend to have a large drain-to-source capacitance which sums when they are connected to parallel. This increased capacitance degrades the performance of the pulse modulator 200 by increasing the rise and fall times of the current pulse. Thus, a tradeoff must be made between maximizing the current amplitude realizable by the pulse modulator and minimizing the rise and fall times of the current pulse. Despite the tradeoff, FETs combine the advantages of higher power, fast switching and high reliability thus making them superior to the above listed alternative switching means for this application. The FETs are all connected to the same node 136, but as shown in FIG. 4, they are connected in a distributed pattern along the length of the node 136. This is done to achieve an even current distribution in node 136.

The degradation of the fall time of the current pulse produced by the PFN can be partially compensated for by a new switching tactic employed in the circuit of FIG. 3. By shutting off the FET switches 170 before the PFN has completely discharged, the long trailing edge of the current pulse, associated with dispersion in the PFN, can be eliminated, thereby improving the fall time.

The large gate-to-drain capacitance of the FETs 170 necessitates the use of a driving circuit 180 to provide enough current to drive the gates rapidly. A driving circuit is connected to the gate of each FET, switching it ON when the gate potential falls below zero volts, and OFF when the gate is grounded. The drive circuits 180 may be driven by a toggle pulse 190, provided from an outside source not shown.

The fabricated version of the circuit of FIG. 3 is shown in FIG. 4, mounted in its housing 300. The circuit is fabricated on a circuit board having a ground plane 301. Node 136 is the distributed node underlying the seven capacitors 160. Each capacitor 160 has one terminal connected to one end of a respective inductor 150 such as at connection 162, and the other terminal is connected to the node 136. The low impedance of the IMPATT diode 132 (about 2 ohms) permits the use of very small valued PFN inductors 150 which could be etched on microstrip. Inductors 150 are thus shown as small square spirals etched on microstrip. The IMPATT diode 132, the charging choke 128 and hold-off diode 126, the FETs 170 and drive circuits 180 are not shown in FIG. 4 as they are mounted on the other side of the circuit board. However, the points of connection of the FETs to the node 136 are indicated at pins 172 where the leads from the FETs protrude slightly above node 136 for soldering purposes.

With the housing 300 closed by securing cover 302 thereto, the fully assembled radar pulse modulator appears as shown in FIG. 5.

A phenomenon associated with IMPATT diode microwave sources is that the frequency of the generated microwave energy will vary as the temperature of the IMPATT diode varies. This phenomenon is called "chirp". Thus, as the curent pulse passes through the diode, the temperature of the diode rises and causes the frequency of generated microwave energy to decrease. This means that, for a single burst of microwave energy, the frequency at the beginning of the pulse gradually shifts downward toward a different frequency at the end of the pulse. One approach to compensate for this phenomenon is to shape or tune the waveform of the current pulse generated by the PFN. By proper wave shaping, the change in operating frequency of the IMPATT diode due to heating can be minimized, thus minimizing chirp. Tunability of the circuit of the present invention is achieved, as illustrated in FIG. 5, by moving metallic slugs 320. These slugs 320 are mounted in apertures such as threaded holes 322 in cover 302. Each hole 322 is located over a respective spiral inductor 150. By advancing a slug 320 into the vicinity of the magnetic field created by the inductor 150, eddy currents are induced in the slug which reduce the inductance of the inductor 150. The change in inductance affects the magnitude of the current pulse contributed by that section of PFN.

The PFN charges to a voltage level which is twice the pulse voltage amplitude that is delivered to the IMPATT diode microwave source. For example, if a ten ampere pulse is required for a diode of five ohms (5Ω) impedance, then fifty (50) volts (10 A×5Ω=50 V) must be pulsed at the output. This means the PFN must be charged to negative one-hundred volts (−100 V).

The pulse forming network must be completely recharged before the onset of the next pulse. Resonant charging allows the capacitors 160 to be fully charged to twice the charging voltage just as the FETs 170 are switched ON, and a current pulse is delivered to the IMPATT diode 132. The rate of charging is determined by the charging choke 128 and the capacitors 160 according to the equation:

$$PRF = \frac{1}{\pi \sqrt{L_{cc} nC}} \quad (4)$$

where PRF is the pulse repetition frequency, $L_{cc}$ is the inductance of the charging choke 128, C is the capacitance per section of the PFN, i.e. the value of each capacitor 160, and n is the number of sections in the PFN.

A pulse modulator was designed and built to the following specifications:

| | |
|---|---|
| pulse width $P_w$ = | 40 nanoseconds |
| rise time = | 5 nanoseconds |
| characteristic impedance $Z_o$ = | 5 ohms |
| PRF = | 100,000 Hz. |
| pulse current I = | 10 amperes |

Using the previously presented equations (1) through (4), the following element values were determined:

| | |
|---|---|
| number of sections | n = 7 |
| inductors 150 | L = 17.8 nanohenries |
| capacitors 160 | C = 459 picofarads |
| charging choke 128 | L = 3.15 millihenries |

Two extra sections were added to the PFN to reduce the current pulse top ripple. Four Supertex VP0210N3, 100 V, p-channel, VMOS, power FETs (170) connected in parallel, were used to switch node 136 of the PFN to ground. Each FET has an ON resistance of 6Ω which is reduced to 1.5Ω when all four are connected in parallel.

Each FET 170 is driven by a National DS0026 clock driver (reference numeral 180 in FIG. 3) which is capacitively coupled to a TTL input controlling pulse (toggle pulse 190). A complete schematic of the circuit as built is shown in FIG. 3.

The dimensions of the square, microstrip, spiral inductors 150 shown in FIG. 4, were calculated using the equation:

$$L = 85 \times 10^{-10} S^{1/2} N^{5/3} \quad (5)$$

where S is the area of the spiral in cm², and N is the number of turns of the spiral. To obtain a PFN inductance of 17.8 nanohenries, the etched spirals have an area of 1 cm² and have 1.6 turns. The fabricated circuit is shown in FIG. 4.

Figure 6:
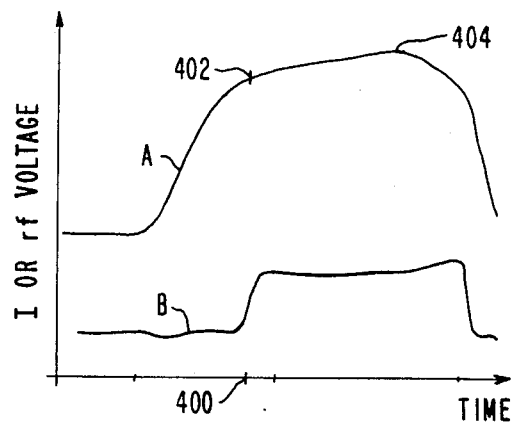
FIG. 6 is a graph of two signals of interest as produced by the pulse modulator and recorded photographically from an oscilloscope screen.

The performance of the actual circuit is summarized by the curves presented in FIG. 6. Curve A represents the current pulse through the IMPATT diode 132 and curve B represents the magnitude of the rf voltage pulse generated by the diode 132 (in this case a millimeter wave IMPATT diode). The two curves are traced on the same time scale and time is the same for each curve. At the time point 400, where rf pulse begins to rise, the current pulse is at a first level 402. The current pulse curve A peaks at point 404 with a magnitude approximately 15% above the magnitude at point 402. In this example the chirp was reduced by a factor of 10 by selective shaping of the current pulse. As fabricated, the overall current tuning range capability of the PFN was approximately 20%. By proper adjustment of the slugs 320, the peak of the current pulse (curve A) could be made to be about 20% above the level of the current pulse at the time that the IMPATT diode 132 begins to generate the rf pulse (i.e., time point 400).

The position of the peak of the current pulse can also be adjusted. For instance, the current pulse could have been shaped so that it ramped from a high current at the leading edge to a low current at the trailing edge, or it could be tailored to peak in the middle of the pulse. By varying the impedance of the section or sections of the PFN whose positive is near the left hand end of the pulse forming network, the shape of the left hand end (i.e. trailing end) of the current pulse can be adjusted.

There has thus been described a new design of pulse modulator which boasts improved current pulse rise and fall times and has a greater pulse tuning range than heretofore attainable. The device is simple and the production costs are much reduced from pulse modulators of conventional design. The physical size and weight of the pulse modulator make it suitable for airborne radar transmitter applications. The size and weight reduction are made possible in large part by the elimination of the inverting transformer 34 commonly used in old pulse modulators.

While the invention has been described with particular reference to the embodiment shown in FIGS. 2 through 6, it is to be understood that the figures are for purposes of illustration and should not be interpreted as limitations upon the invention. One of ordinary skill in the art may devise various changes, modifications or substitutions of elements without departing from the scope of the invention which is intended to be defined by the appended claims.

What is claimed is:

1. A pulse modulator comprising a pulse forming network mounted within a housing:
    said pulse forming network including a plurality of microstrip spiral inductors;
    a plurality of apertures in said housing, each said aperture being juxtaposed with a respective microstrip spiral inductor;
    a plurality of metallic slugs each of which is moveably mounted in a respective one of said plurality of aperatures;
    whereby said slugs may be adjustably positioned relative to said inductors to vary the inductance thereof, whereby the shape of the current waveform output from said pulse modulator, may be adjusted.

* * * * *